US005546569A

United States Patent [19]
Proebsting et al.

[11] Patent Number: 5,546,569
[45] Date of Patent: Aug. 13, 1996

[54] APPARATUS FOR WRITING DATA TO AND READING DATA FROM A MULTI-PORT RAM IN A SINGLE CLOCK CYCLE

[75] Inventors: Robert J. Proebsting, Los Altos Hills; Raymond A. Heald, Los Altos, both of Calif.

[73] Assignee: Intergraph Corporation, Huntsville, Ala.

[21] Appl. No.: 118,378

[22] Filed: Sep. 8, 1993

Related U.S. Application Data

[63] Continuation-in-part of Ser. No. 23,797, Feb. 19, 1993, abandoned.

[51] Int. Cl.⁶ ................................................. G11C 7/00
[52] U.S. Cl. ............. 395/550; 365/189.04; 364/DIG. 1; 364/271.9; 364/249.8
[58] Field of Search .................. 395/550; 365/189.4, 365/189.01, 233

[56] References Cited

U.S. PATENT DOCUMENTS

| | | | |
|---|---|---|---|
| 4,783,732 | 11/1988 | Morton | 364/200 |
| 4,811,296 | 3/1989 | Garde | 365/189 |
| 5,226,005 | 6/1993 | Lee et al. | 365/49 |
| 5,276,837 | 1/1994 | Sakave | 395/425 |
| 5,321,652 | 6/1994 | Ito | 365/189.07 |

*Primary Examiner*—Kevin A. Kriess
*Attorney, Agent, or Firm*—Townsend and Townsend and Crew, LLP

[57] ABSTRACT

A clock generator generates repetitive master clock pulses, each master clock pulse having a leading edge and a trailing edge. The time interval between the leading edge of a first master clock pulse and the leading edge of a second master clock pulse defines a single clock cycle. A write pulse generating circuit generates write pulses for writing data into a multi-port RAM, and a read pulse generating circuit generates read pulses for reading data from the RAM. When simultaneous reading and writing of data is requested in a particular clock cycle, the leading edge of the write pulse is generated in response to the leading edge of the first master clock pulse before the leading edge of the second master clock pulse. The leading edge of the read pulse is generated after the leading edge of the write pulse, such that the data written into the memory can be read out of the memory during the same clock cycle through a different port with the only common connection being the memory cells.

40 Claims, 4 Drawing Sheets

APPARATUS FOR WRITING DATA TO AND READING DATA FROM A MULTI-PORT RAM IN A SINGLE CLOCK CYCLE

CROSS-REFERENCE TO RELATED APPLICATION

This application is a continuation-in-part of application Ser. No. 08/023,797 filed Feb. 19, 1993, now abandoned.

BACKGROUND OF THE INVENTION

Microprocessors which use random access memories (RAMs) for temporary storage of data typically write the data into the memory during a first clock cycle and then read the data from the memory one or more clock cycles later. However, a problem arises when a program requests data during the same cycle in which the requested data is being stored in the RAM. Since there is no way to ensure that the requested data has been completely written into the RAM at the time of the request, simultaneous reading and writing of data ordinarily is not possible.

To avoid the foregoing problem, known systems compare the address of the requested data with the write address being applied to the RAM to see if the addresses are the same. If the addresses match, then bypass gates are used to route the data directly from the input to the output of the RAM. Unfortunately, the hardware needed to implement the comparison and bypass functions require several levels of logic and is typically very complex and expensive. For example, assume a memory has two read ports and three write ports. Each time a read address is applied to one of the read ports, the read address is compared with up to three write addresses (depending upon the number of write addresses being applied to the write ports). Thus, hardware for a total of 2×3=6 address comparisons must be provided with the RAM chip. Additionally, if a read address matches a write address, then the data at the write port must be routed to the corresponding read port. This requires 2×3=6 bypass paths. If the data stored in each memory location is 64 bits long, then a total of 6×64 384 bypass paths are required. The complexity of the circuitry and added hardware (which consumes an inordinate amount of chip area) makes bypass techniques undesirable in many applications.

SUMMARY OF THE INVENTION

The present invention is directed to an apparatus for writing data to and reading data from a RAM in a single clock cycle without requiring complex hardware bypass paths. In one embodiment of the present invention, a clock generator generates repetitive master clock pulses, each master clock pulse having a leading edge and a trailing edge. The time interval between the leading edge of a first master clock pulse and the leading edge of a second master clock pulse defines a single clock cycle. A write pulse generating circuit generates write pulses for writing data into a multi-port RAM, and a read pulse generating circuit generates read pulses for reading data from the RAM. When simultaneous reading and writing of data is requested in a particular clock cycle, the leading edge of the write pulse is generated in response to the leading edge of the first master clock pulse and before the leading edge of the second master clock pulse. The leading edge of the read pulse is generated after the leading edge of the write pulse such that the data written into the memory can be read out of the memory during the same clock cycle through a different port with the only common connection being the memory cells. That is, bypass paths are not required. The write pulses are timed so that the data is written into the RAM some fraction of a clock cycle, e.g., approximately one quarter of a clock cycle prior to the leading edge of the read pulse.

DETAILED DESCRIPTION OF THE PREFERRED EMBODIMENTS

Figure 1:
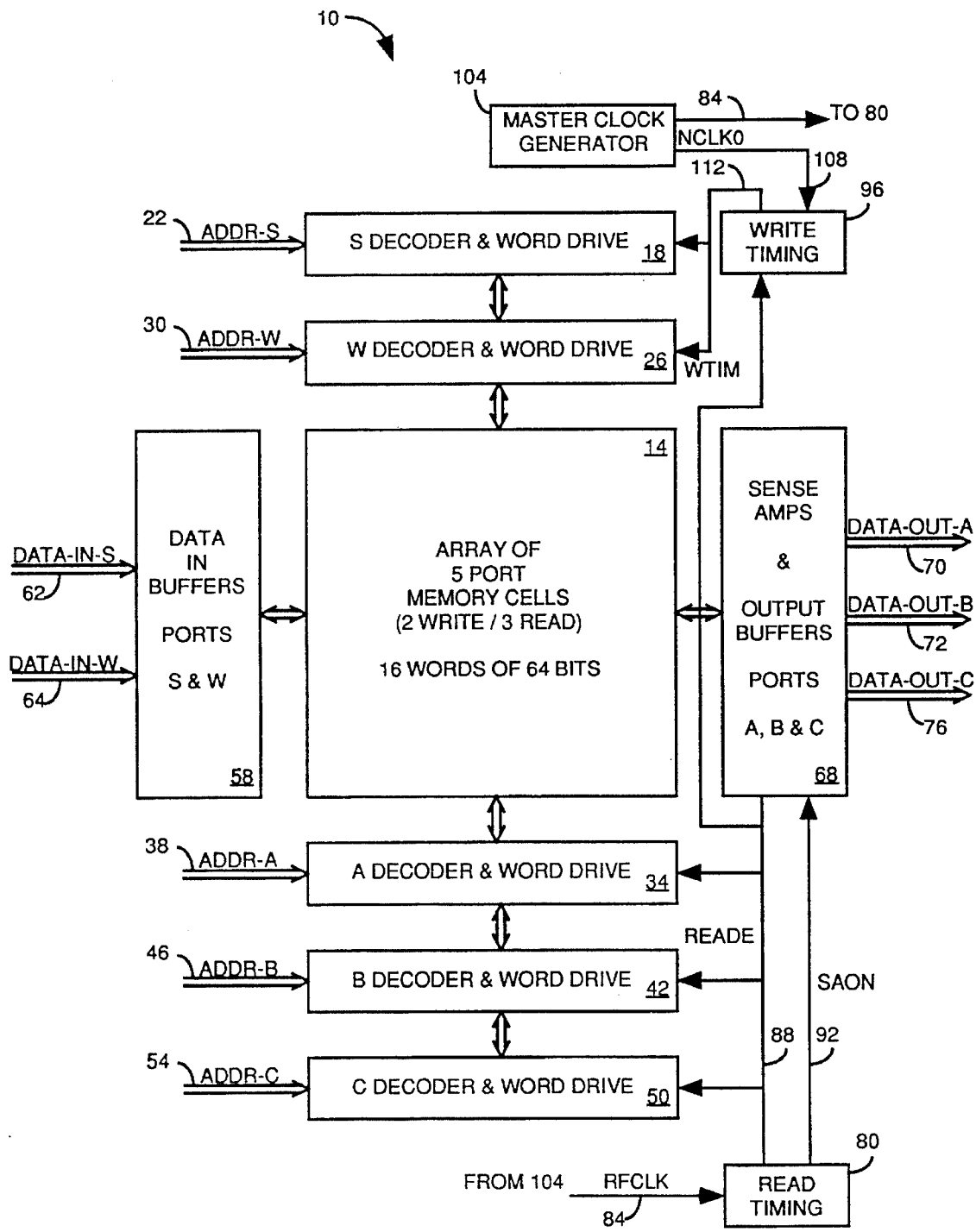
FIG. 1 is a block diagram of a particular embodiment of an apparatus according to the present invention for writing data to and reading data from a random access memory in a single clock cycle.

FIG. 1 is a block diagram of an apparatus 10 for writing data to and reading data from a memory 14 in a single clock cycle. In this embodiment, memory 14 comprises an array of five port memory cells, e.g., two write ports (S, W) and three read ports (A, B, C). Data writes to memory 14 are controlled by an S-port decode and word drive circuit 18 and a W-port decode and word drive circuit 26 which receive S-port addresses over an ADDR-S bus 22 and W-port addresses over an ADDR-W bus 30, respectively. Data written to memory 14 is buffered by an input buffer 58 which receives data for the S and W ports over a DATA-IN-S bus 62 and a DATA-IN-W bus 64, respectively. Data reads from memory 14 are controlled by an A-port decode and word drive circuit 34, a B-port decode and word drive circuit 42, and a C-port decode and word drive circuit 50 which receive A-port addresses over an ADDR-A bus 38, B-port addresses over an ADDR-B bus 46, and C-port addresses over an ADDR-C bus 54, respectively. Data is read from memory 14 using a sense amp/output buffer circuit 68 which communicates data to a DATA-OUT-A bus 70, a DATA-OUT-B bus 72, and a DATA-OUT-C bus 76 corresponding to ports A, B, and C, respectively.

A read timing circuit 80 controls the reading of data from memory 14. Read timing circuit 80 receives RFCLK clock pulses (see FIG. 5) over a line 84 from a master clock generator 104 and, in response thereto, provides conventional read-enable (READE) signals and sense-amp-on (SAON) signals to sense amp/output buffer circuit 68 over lines 88 and 92, respectively. Furthermore, the READE signals on line 88 are communicated to A-port decode and word drive circuit 34, to B-port decode and word drive circuit 42, to C-port decode and word drive circuit 50, and to a write timing circuit 96. In this embodiment, the READE signals may be derived from the RFCLK clock pulses received on line 84 using post-charge logic delays such as that disclosed in U.S. Pat. No. 4,985,643 issued to Robert J. Proebsting and incorporated herein by reference.

Write timing circuit 96 receives NCLK0 pulses from master clock generator 104 on a line 108 in addition to the READE signals received on line 88. In response to those signals, write timing circuit 96 provides write timing (WTIM) signals to S-port decode and word drive circuit 18 and W-port decode and word drive circuit 26 over a line 112 for enabling the write operation. The purpose of write timing circuit 96 is to generate the WTIM signals at the proper time before the occurrence of the READE signals so that data is written into memory 14 before the corresponding read operation. In this embodiment, the WTIM signals are timed so that they begin some fraction of a clock cycle, e.g., approximately one quarter of a clock cycle after the beginning of a clock cycle and approximately one quarter of a clock cycle prior to the leading edge of the READE pulse.

Figure 2:
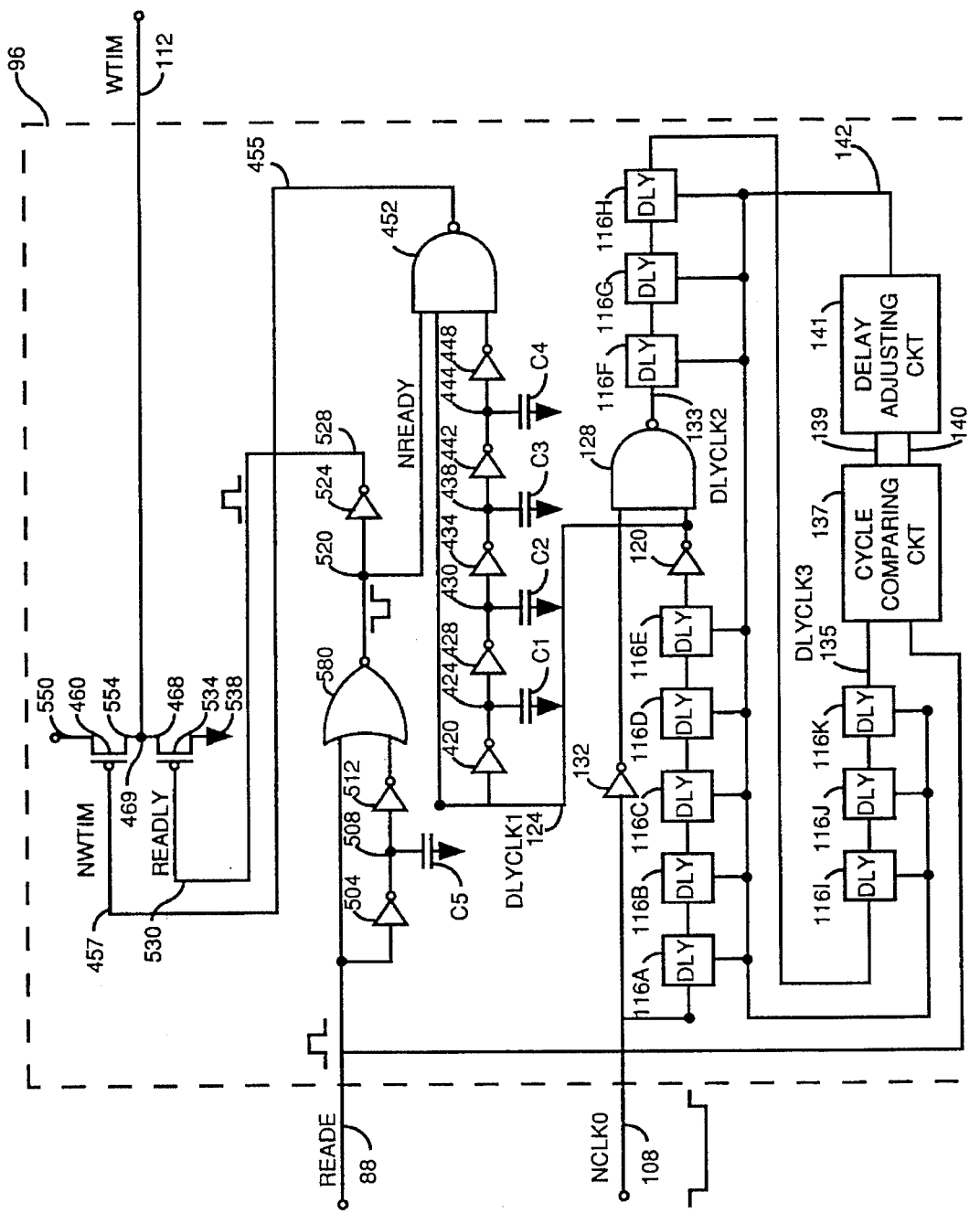
FIG. 2 is a schematic diagram of a particular embodiment of the write timing circuit shown in FIG. 1.
Figure 5:
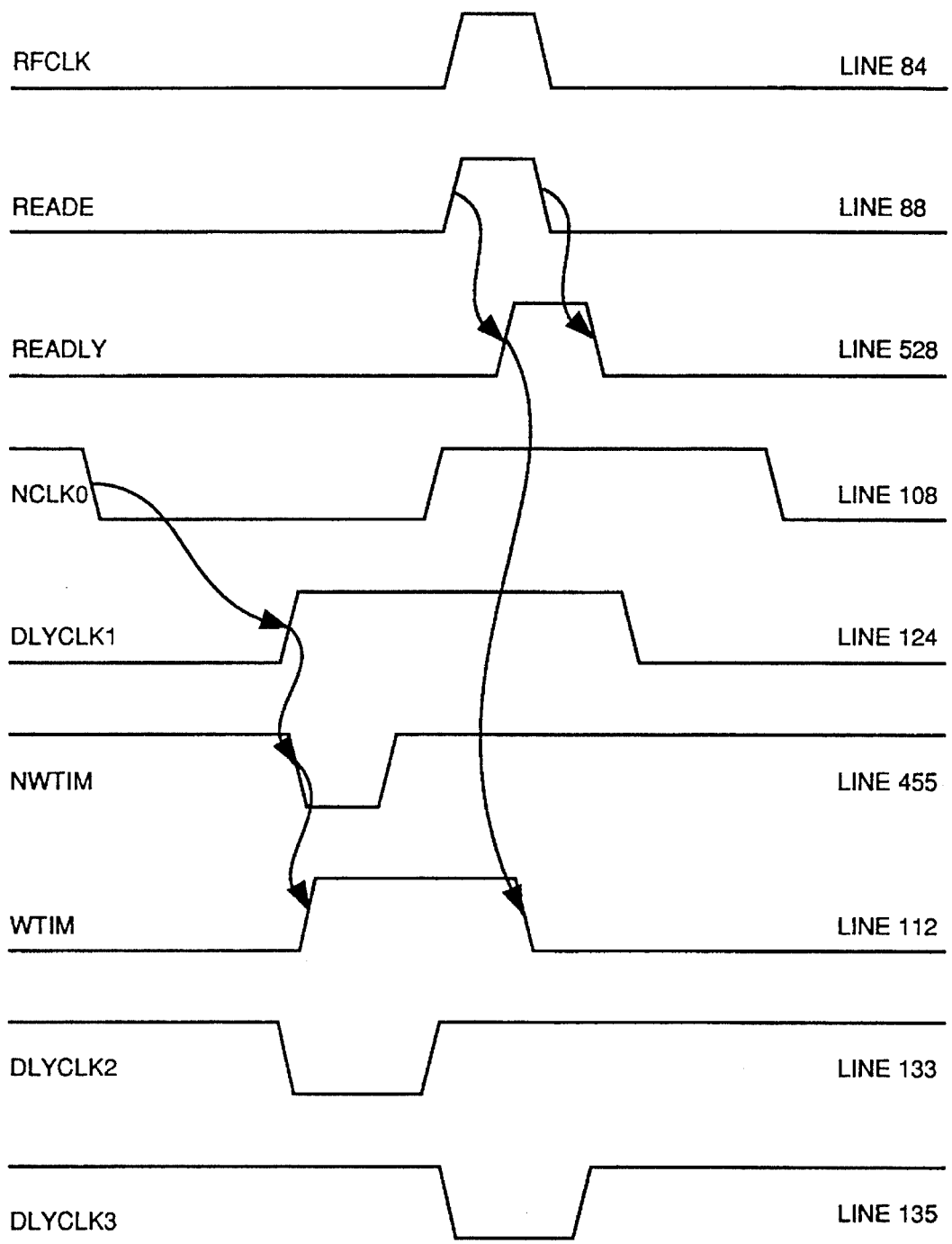
FIG. 5 is a timing diagram showing signals generated by the circuit shown in FIG. 2.

FIG. 2 is a schematic diagram of relevant portions of write timing circuit 96. The NCLK0 pulses received on line 108 pass through a plurality of serially connected delay elements 116A–E and through an inverter 120 to produce a delayed clock signal (DLYCLK1, FIG. 5) on a line 124. Line 124 is coupled to an input terminal of a NAND gate 128. The other input terminal of NAND gate 128 is coupled to the output terminal of NAND gate 128 is coupled to a line 133 and provides a DLYCLK2 pulse as shown in FIG. 5. Line 133 is coupled to a further plurality of serially connected delay elements 116F–116K. The output terminal of delay element 116K is coupled to a line 135 and provides a DLYCLK3 pulse as shown in FIG. 5. As discussed below, the timing of the DLYCLK1 and DLYCLK3 pulses have a specific relationship to the timing of the READE pulse.

To insure that the DLYCLK1 and DLYCLK3 pulses occur at the proper time relative to the READE pulse, the DLYCLK3 pulse on line 135 and the READE pulse on line 88 are communicated to a cycle comparing circuit 137. Cycle comparing circuit 137 compares the arrival of the READE pulse with the arrival of the DLYCLK3 pulse and, if the proper relationship between the two pulses does not exist, then cycle comparing circuit 137 provides signals on a line 139 to a delay adjusting circuit 141. Delay adjusting circuit 141 thereafter provides signals on a line 142 for adjusting the delay of delay elements 116A–K. That is, if the DLYCLK3 pulse occurs too soon, then delay adjusting circuit 141 provides signals on line 142 for increasing the delay of delay circuits 116A–K. Similarly, if the DLYCLK3 pulse occurs too late, then delay adjusting circuit provides signals on line 142 for decreasing the delay of delay circuits 116A–K.

Figure 3:
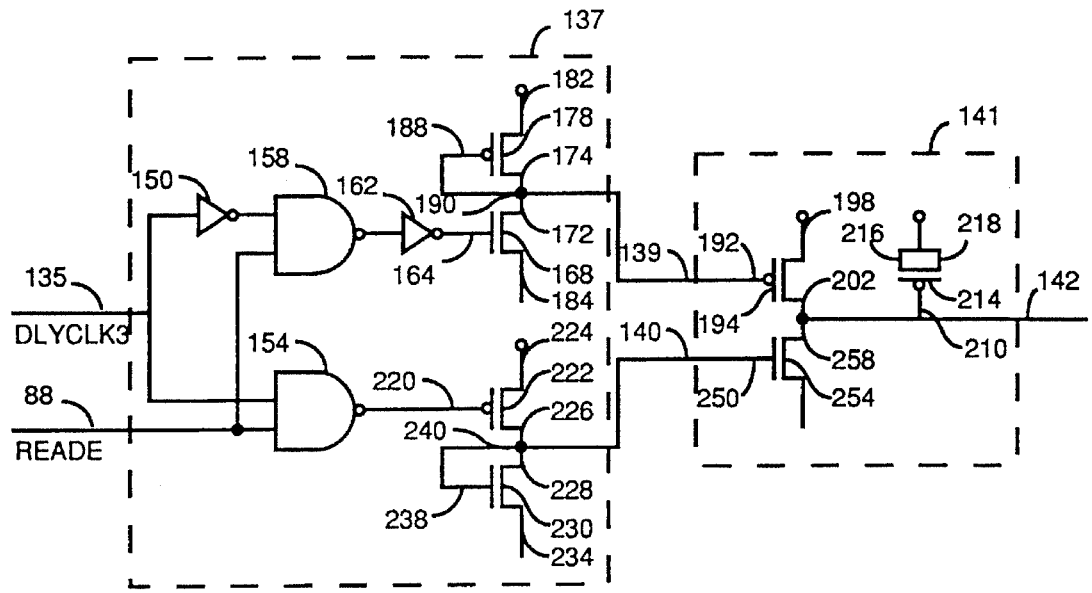
FIG. 3 is a schematic diagram of a particular embodiment of the cycle comparing circuit and the delay adjusting circuit shown in FIG. 2.

FIG. 3 is a schematic diagram of a particular embodiment of cycle comparing circuit 137 and delay adjusting circuit 141. Line 135 is coupled to an input terminal of an inverter 150 and to an input terminal of a NAND gate 154. The output terminal of inverter 150 is coupled to an input terminal of a NAND gate 158. The other input terminals of NAND gates 154 and 158 are coupled to line 88 for receiving the READE signals therefrom. The output terminal of NAND gate 158 is coupled to an input terminal of an inverter 162, and the output terminal of inverter 162 is coupled to the gate terminal 164 of a NMOS transistor 168. The drain terminal 172 of NMOS transistor 168 is coupled to a node 190 between line 139, a drain terminal 174 of a PMOS transistor 178, and a gate terminal 188 of PMOS transistor 178. The source terminal 184 of NMOS transistor 168 is coupled to a ground potential, and the source terminal 182 of PMOS transistor 178 is coupled to a positive voltage source.

The output terminal of NAND gate 154 is coupled to the gate terminal 220 of a PMOS transistor 222. The drain terminal 226 of PMOS transistor 222 is coupled to a node 240 between line 140, a drain terminal 228 of a NMOS transistor 230, and a gate terminal 238 of NMOS transistor 230. The source terminal 224 of PMOS transistor 222 is coupled to the positive voltage source, and the source terminal 234 of NMOS transistor 230 is coupled to the ground potential.

From inspection of FIG. 3 it should be apparent that the READE signal enables the operation of NMOS transistor 168, PMOS transistor 178, PMOS transistor 222, and NMOS transistor 230. When the READE signal is low, then the outputs of NAND gates 154 and 158 are forced high regardless of the state of the DLYCLK3 signal, and NMOS transistor 168, PMOS transistor 178, PMOS transistor 222, and NMOS transistor 230 remain off. When the READE signal is high, then NMOS transistor 168, PMOS transistor 178, PMOS transistor 222, and NMOS transistor 230 selectively turn on in response to the DLYCLK3 signal. Thus, when the DLYCLK3 signal is low, then NMOS transistor 168 and PMOS transistor 178 are on, and PMOS transistor 222 and NMOS transistor 230 are off. When the DLYCLK3 signal is high, then PMOS transistor 222 and NMOS transistor 230 are on, and NMOS transistor 168 and PMOS transistor 178 are off. How long the transistors are on or off depends on the relative positions of the READE and DLYCLK3 signals. NMOS transistor 168 and PMOS transistor 178 are on for the same amount of time as PMOS transistor 222 and NMOS transistor 230 when the high portion of the READE pulse is centered at the negative transition of the DLYCLK3 pulse. NMOS transistor 168 and PMOS transistor 178 are on for a greater amount of time than PMOS transistor 222 and NMOS transistor 230 when the negative transition of the DLYCLK3 pulse leads the center of the high portion of the READE pulse, and NMOS transistor 168 and PMOS transistor 178 are on for a lesser amount of time than PMOS transistor 222 and NMOS transistor 230 when the negative transition of the DLYCLK3 pulse lags behind the center of the high portion of the READE pulse.

Line 139 is coupled to a gate terminal 192 of a PMOS transistor 194, and line 140 is coupled to a gate terminal 250 of a NMOS transistor 254. The source terminal 198 of PMOS transistor 194 is coupled to the positive voltage source, and the drain terminal 202 of PMOS transistor 194 is coupled to a node 260 between line 142 and a drain terminal 258 of NMOS transistor 254. The source terminal 264 of NMOS transistor 254 is coupled to the ground potential.

Line 142 is further coupled to a gate terminal 210 of a PMOS transistor 214. The source and drain terminals 216, 218, respectively, of PMOS transistor 214 are coupled together and to the positive voltage source. PMOS transistor 214 thus functions as a capacitance in the circuit and provides a voltage on line 142 for adjusting the delay of delay elements 116A–K which, in turn, sets the total delay of the DLYCLK signal as a selected percentage of the NCLK0 low phase (half period for a normal 50% duty cycle). The voltage on line 142 increases when PMOS transistor 194 turns on (i.e., when NMOS transistor 168 and PMOS transistor 178 are on), and the voltage on line 142 decreases when transistor 254 turns on (i.e., when PMOS transistor 222 and NMOS transistor 230 are on). Thus, there is a net voltage increase on line 142 when the negative transition of the DLYCLK3 pulse leads the center point of the high portion of the READE pulse, and there is a net voltage decrease on line 142 when the negative transition of the DLYCLK3 pulse lags behind the center point of the high portion of the READE pulse.

Figure 4:
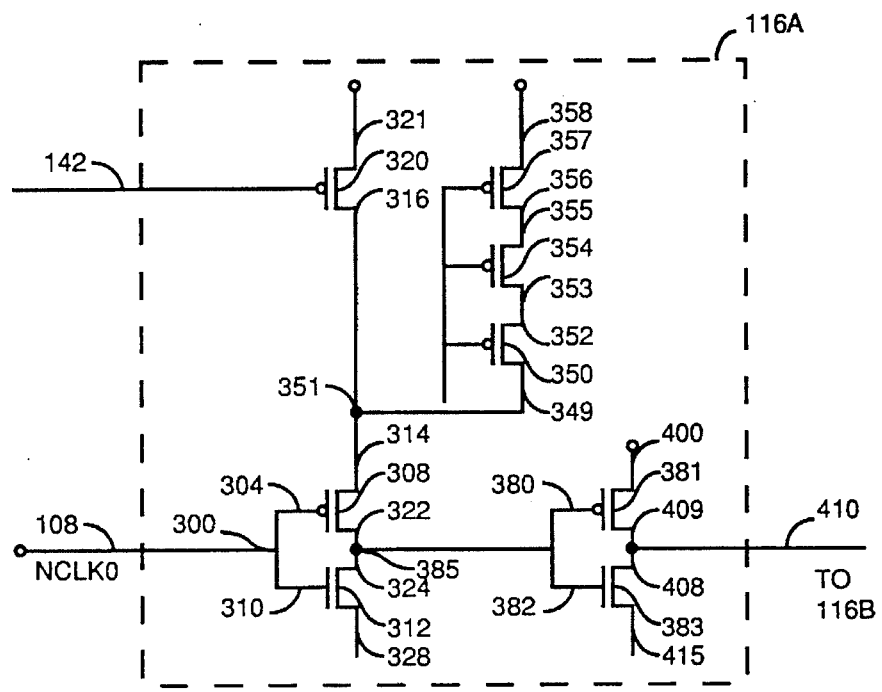
FIG. 4 is a schematic diagram of a particular embodiment of a delay circuit shown in FIG. 2.

FIG. 4 is a schematic diagram of delay element 116A. The other delay elements (116B–116K) are constructed the same. The NCLK0 signals on line 108 are communicated to a node 300 between the gate terminal 304 of a PMOS transistor 308 and the gate terminal 310 of ANMOS transistor 312. The drain terminal 322 of PMOS transistor 308 is coupled to the drain terminal 324 of NMOS transistor 312 at a node 385, and the source terminal 328 of NMOS transistor 312 is coupled to the ground potential. The source terminal 314 of PMOS transistor 308 is coupled to the drain terminal 316 of a PMOS transistor 320 at a node 351. The source terminal 321 of PMOS transistor 320 is coupled to the positive voltage source, and the gate terminal of PMOS transistor 320 is coupled to line 142.

The drain terminal 349 of a PMOS transistor 350 is coupled to node 351, and the source terminal 352 of PMOS transistor 350 is coupled to the drain terminal 353 of a PMOS transistor 354. The source terminal 355 of PMOS transistor 354 is coupled to the drain terminal 356 of a PMOS transistor 357, and the source terminal 358 of PMOS transistor 357 is coupled to the positive voltage source. The gate terminals of each PMOS transistor 350, 354 and 357 are coupled together and to the ground potential. Thus, PMOS transistors 350, 354, and 357 are always on for providing current to node 351. PMOS transistors 350, 354, and 357 are relatively small and provide a low current (e.g., on the order of ten microamps) to node 351.

The gate terminal 380 of a PMOS transistor 381 is coupled to a gate terminal 382 of a NMOS transistor 383, and both gate terminals are coupled to node 385. The source terminal 400 of PMOS transistor 381 is coupled to the positive voltage source, and the drain terminal 404 of PMOS transistor 381 is coupled to the drain terminal 408 of NMOS transistor 383 at a node 409. The source terminal 415 of NMOS transistor 383 is coupled to the ground potential. An output line 410 of circuit 116A is coupled to node 409 for providing a delayed copy of the NCLK0 pulse to delay element 116B.

In general, the delay provided by delay element 116A is determined by the voltage on line 206. As noted above, the voltage on line 206 increases when the negative transition of the DLYCLK3 pulse leads the center point of the high portion of the READE pulse, and the voltage on line 206 decreases when the negative transition of the DLYCLK3 pulse lags behind the center point of the high portion of the READE pulse. Thus, delay element 116A should increase the amount of delay (to slow down the DLYCLK3 pulse) when the voltage on line 206 increases, and delay element 116A should decrease the amount of delay (to speed up the DLYCLK3 pulse) when the voltage on line 206 decreases.

To understand how delay element 116A accomplishes this task, it should be noted that the amount of delay between the time the signal on line 108 goes low and the time the signal on line 410 goes low is determined by how fast node 385 is pulled high by the current flowing through PMOS transistor 308 (since how fast node 385 is pulled high determines how soon PMOS transistor 381 and NMOS transistor 383 turn on and off). When the signal on line 108 is low and the signal on line 206 is high, PMOS transistor 320 is off, and node 385 is pulled high very slowly as a result of the small current through PMOS transistors 350, 354, and 357. Consequently, a relatively large interval of time passes before node 385 is pulled high enough to turn off PMOS transistor 381 and turn on NMOS transistor 383 to provide the low signal on line 410. As the voltage on line 206 decreases, PMOS transistor 320 turns on for increasing current flow through PMOS transistor 308. The lower the voltage on line 142, the more current flows through PMOS transistors 308 and 320, and the faster node 385 is pulled high. The faster node 385 is pulled high, the sooner PMOS transistor 381 turns off and NMOS transistor 383 turns on, and the sooner a low transition appears on line 410.

The process repeats itself in the remaining cascaded delay elements 116B–K, and the voltage on line 142 is adjusted up or down by delay adjusting circuit 141 until the negative transition of the DLYCLK3 pulse aligns with the center point of the high portion of the READE pulse. The number of delay elements 116A–K, and the attachment point of line 124 (FIG. 2) are chosen so that the DLYCLK1 pulse occurs at the proper time to cause the WTIM signal to be generated approximately one quarter of the NCLK0 cycle before the READE pulse.

The DLYCLK signals on line 124 are communicated to an input terminal of an inverter 420. The output terminal of inverter 420 is coupled to a node 424 between one terminal of a capacitor C1 and an input terminal of an inverter 428, and the output terminal of inverter 428 is coupled to a node 430 between one terminal of a capacitor C2 and an input terminal of an inverter 434. The output terminal of inverter 434 is coupled to a node 438 between one terminal of a capacitor C3 and an input terminal of an inverter 442, and the output terminal of inverter 442 is coupled to a node 444 between one terminal of a capacitor C4 and an input terminal of an inverter 448. The other terminal of each capacitor C1–C4 is coupled to the ground potential.

The output terminal of inverter 448 is coupled to an input terminal of a NAND gate 452. A second input terminal of NAND gate 452 is coupled directly to line 124 for receiving the DLYCLK signals therefrom. An output terminal of NAND gate 452 is coupled to a line 455 which provides NWTIM signals to the gate terminal 457 of a PMOS transistor 460.

The READE signals on line 88 are communicated to an input terminal of a NOR gate 500 and to an input terminal of an inverter 504. The output terminal of inverter 504 is coupled to a node 508 between one terminal of a capacitor C5 and an input terminal of an inverter 512. The other terminal of capacitor C5 is coupled to the ground potential, and the output terminal of inverter 512 is coupled to the other input terminal of NOR gate 500. The output terminal of NOR gate 500 is coupled to a node 520 between an input terminal of an inverter 524 and a third input terminal of NAND gate 452. The output terminal of inverter 524 is coupled to a line 528 which provides READLY signals to the gate terminal 530 of an NMOS transistor 534. The source terminal 550 of PMOS transistor 460 is coupled to the positive voltage source, and the drain terminal 554 of PMOS transistor 460 is coupled to a node 464 between the drain terminal 468 of NMOS transistor 534 and line 112. The source terminal 538 of transistor 534 is coupled to the ground potential.

To write data into memory 14, a first write address is placed on ADDR-S bus 22 and/or a second write address is placed on ADDR-W bus 30. This conditions (or requests) the write operation for the corresponding port. At the same time, a first set of data is placed on DATA-IN-S bus 62 and/or a second set of data is placed on DATA-IN-W bus 64. S-port decode and word drive circuit 18 and W-port decode and word drive circuit 26 decode their respective addresses (if any) and activate corresponding word lines in memory 14. When the WTIM signal appears on line 112, any data on DATA-IN-S bus 62 or DATA-IN-W bus 64 is transferred into the selected memory cell.

To read data from memory 14, a first read address is placed on ADDR-A bus 38 and/or a second read address is placed on ADDR-B bus 46 and/or a third read address is placed on ADDR-C bus 54. This conditions (or requests) the read operation for the corresponding port. A-port decode and word drive circuit 34, B-port decode and word drive circuit 42, and C-port decode and word drive circuit 50 decode their respective addresses (if any) and activate corresponding word lines in memory 14. When the READE signal appears on line 88, the data at the selected memory cells is transferred to DATA-OUT-A bus 70, DATA-OUT-B bus 72, or DATA-OUT-C bus 76 as appropriate.

FIG. 5 is the timing diagram showing the RFCLK signals on line 84, the READE signals on line 88, the READLY signals on line 528, the NCLK0 signals on line 108, the DLYCLK1 signals on line 124, the NWTIM signals on line 455, the WTIM signals on line 112, the DLYCLK2 signals on line 133, and the DLYCLK3 signals on line 135 when data is to be written to and read from RAM 14 in a single clock cycle. As shown in FIGS. 2 and 5, the NCLK0 pulse on line 108 is delayed (via delay elements 116A–E) and inverted (via inverter 120) for producing the DLYCLK1 pulse received on line 124. NAND gate 452 produces the NWTIM pulse on line 455 from the DLYCLK1 pulse on line 124. The NWTIM pulse has a width that is substantially shorter than the DLYCLK1 pulse and is used to turn on transistor 460. This, in turn, causes the signal on line 112 to go high and hence creates the leading edge of the WTIM pulse on line 112.

The READE pulse on line 88 is expanded by inverter 504, capacitor C5, inverter 512, and NOR gate 500 to produce the READLY pulse on line 528 for turning on transistor 534. This, in turn, causes the signal on line 112 to go low and hence creates the trailing edge of the WTIM pulse on line 112. This, in turn, causes the signal on line 112 to go low and hence creates the trailing edge of the WTIM pulse on line 112.

The time interval between the leading edge of the first active low NCLK0 pulse and the leading edge of the second active low NCLK0 pulse on line 108 defines a single clock cycle. The write pulses are timed so that the data is written into memory 14 some fraction of a clock cycle, e.g., approximately one quarter of a clock cycle prior to the leading edge of the READE pulse. Thus, when the READE pulse is generated, data may be reliably read from memory 14 through a different port, and the entire write/read cycle occurs in a single master clock cycle.

While the above is a complete description of a preferred embodiment of the present invention, various modifications may be employed. Consequently, the scope of the invention should be ascertained from the claims.

What is claimed is:

1. An apparatus for writing a data bit and reading the data bit in a single clock cycle, the apparatus comprising:

a memory having a read enable terminal and a write enable terminal, for storing the data bit in response to a write signal on the write enable terminal, and for returning the data bit in response to a read signal on the read enable terminal;

a master clock circuit for generating a first and a second master clock pulse, the first and the second master clock pulses each having a leading edge and a trailing edge, wherein a time interval between the leading edge of the first master clock pulse and the leading edge of the second master clock pulse defines the single clock cycle;

a write signal circuit, coupled to the write enable terminal, for generating the write signal, the write signal having a leading edge and a trailing edge, the leading edge of the write signal being generated between the leading edge of the first master clock pulse and the leading edge of the second master clock pulse; and a read signal circuit, coupled to the read enable terminal, for generating the read signal, the read signal having a leading edge and a trailing edge, the leading edge of the read signal being generated after the leading edge of the write signal and before the leading edge of the second master clock pulse.

2. The apparatus according to claim 1:

wherein the write signal circuit generates the trailing edge of the write signal before the leading edge of the second master clock pulse; and wherein the read signal circuit generates the trailing edge of the read signal before the leading edge of the second master clock pulse.

3. The apparatus according to claim 1 wherein the write pulse means generates the leading edge of the write pulse in response to the leading edge of the first master clock pulse.

4. The apparatus according to claim 3 wherein the write pulse means is coupled to the read pulse means and generates the trailing edge of the write pulse in response to the leading edge of the read pulse.

5. The apparatus according to claim 4 wherein the read pulse means generates the trailing edge of the read pulse before the leading edge of the second master clock pulse.

6. The apparatus according to claim 5 wherein the write pulse means generates the trailing edge of the write pulse before the leading edge of the second master clock pulse.

7. The apparatus according to claim 2 wherein the write signal circuit further comprises:

a delay circuit, coupled to the master clock circuit, for delaying the leading edge of the first master clock pulse to form a leading edge of a delay clock pulse, and for delaying the trailing edge of the first master clock pulse to form a trailing edge of the delay clock pulse.

8. The apparatus according to claim 7 wherein the write pulse means generates the leading edge of the write pulse in response to the leading edge of the delay clock pulse.

9. An apparatus for writing a data bit and reading the data bit in a single clock cycle, the apparatus comprising:

a memory having a read enable terminal and a write enable terminal, for storing the data bit in response to a write signal on the write enable terminal, and for returning the data bit in response to a read signal on the read enable terminal;

a master clock circuit for generating a first and a second master clock pulse, the first and the second master clock pulses each having a leading edge and a trailing edge, wherein a time interval between the leading edge of the first master clock pulse and the leading edge of the second master clock pulse defines the single clock cycle;

a first delay circuit, coupled to the master clock circuit, for delaying the leading edge of the first master clock pulse to form a leading edge of a delay clock pulse, and for delaying the trailing edge of the first master clock pulse to form a trailing edge of the delay clock pulse;

a NAND gate, coupled to the first delay circuit, having a first input terminal, a second input terminal, and an output terminal, the first input terminal coupled to the first delay circuit for receiving the delay clock pulse;

a second delay circuit, coupled to the first delay circuit, for delaying the leading edge of the delay clock pulse to form a delayed leading edge of the delay clock pulse;

an inverter, coupled to the second delay circuit and to the NAND gate, the inverter having an input terminal and an output terminal, the input terminal coupled to the second delay circuit and the output terminal coupled to the second input terminal of the NAND gate;

wherein the NAND gate produces a signal having a leading edge and a trailing edge in response to the delay clock pulse, the signal having a width substantially shorter than a width of the delay clock pulse;

a write signal circuit, coupled to the NAND gate and to the memory, for generating the write signal, the write signal having a leading edge and a trailing edge, the leading edge of the write signal being generated in response to the leading edge of the signal from the NAND gate;

a read signal circuit, coupled to the memory and to the write signal circuit, for generating the read signal, the read signal having a leading edge and a trailing edge, the leading edge of the read signal being generated after the leading edge of the write signal, and the leading edge and the trailing edge of the read signal being generated before the leading edge of the second master clock pulse; and wherein the write signal circuit generates the trailing edge of the write signal in response to the leading edge of the read signal.

10. The apparatus according to claim 9 wherein the write signal circuit comprises:

a first transistor, coupled to the NAND gate, having a control terminal, a first current flowing terminal, and a second current flowing terminal, the control terminal of the first transistor coupled to the output terminal of the NAND gate, the first current flowing terminal of the first transistor coupled to a current source, and the second current flowing terminal of the first transistor coupled to write enable terminal; and a second transistor, coupled to the read signal circuit and to the first transistor, having a control terminal a first current flowing terminal, and a second current flowing terminal, the control terminal of the second transistor coupled to the read signal circuit, the first current flowing terminal of the second transistor coupled to the write enable terminal, and the second current flowing terminal of the second transistor coupled to a current sink; and wherein a current flows through the first transistor in response to the pulse from the output terminal of the NAND gate generating the leading edge of the write pulse, and wherein a current flows through the second transistor in response to the read signal generating the trailing edge of the write signal.

11. An apparatus for writing a data bit and reading the data bit in a single clock cycle, the apparatus comprising:

a memory for storing the data bit in an addressable storage location and for retrieving the data bit from the addressable storage location, the memory including:

a data input terminal for receiving the data bit to be stored in the memory;

a data output terminal for returning the data bit stored in the memory;

a write enable terminal for enabling writing of the data bit from the data input terminal into the addressable storage location in response to a write signal;

a write address input terminal for receiving the addressable storage location addressed by a write address;

a read enable terminal for enabling reading of the data bit from the addressable storage location in response to a read signal, the read signal being generated after the write signal;

a read address input terminal for receiving the addressable storage location addressed by a read address;

a master clock circuit for generating a first and a second master clock pulse;

a write signal circuit, coupled to the write enable terminal, for providing a write signal to the write enable terminal during the first master clock pulse; and a read signal circuit, coupled to the read enable terminal, for providing a read signal to the read enable terminal during the first master clock pulse.

12. The apparatus according to claim 11:

wherein the first and the second master clock pulses each have a leading edge and a trailing edge, a time interval between the leading edge of the first master clock pulse and the leading edge of the second master clock pulse defining the single clock cycle;

wherein the write signal circuit includes a write pulse circuit for generating a write pulse having a leading edge and a trailing edge, the leading edge of the write pulse being generated between the leading edge of the first master clock pulse and the leading edge of the second master clock pulse; and wherein the read signal circuit includes a read pulse circuit for generating a read pulse having a leading edge and a trailing edge, the leading edge of the read pulse being generated after the leading edge of the write pulse.

13. The apparatus according to claim 12 wherein the write pulse means generates the trailing edge of the write pulse before the leading edge of the second master clock pulse, and wherein the read pulse means generates the trailing edge of the read pulse before the leading edge of the second master clock pulse.

14. The apparatus according to claim 12 wherein the write pulse means generates the leading edge of the write pulse in response to the leading edge of the first master clock pulse.

15. The apparatus according to claim 14 wherein the write pulse means is coupled to the read pulse means and generates the trailing edge of the write pulse in response to the leading edge of the read pulse.

16. The apparatus according to claim 15 wherein the read pulse means generates the trailing edge of the read pulse before the leading edge of the second master clock pulse.

17. The apparatus according to claim 16 wherein the write pulse means generates the trailing edge of the write pulse before the leading edge of the second master clock pulse.

18. The apparatus according to claim 13 wherein the write signal circuit further comprises:

a delay circuit, coupled to the master clock circuit, for delaying the leading edge of the first master clock pulse to form a leading edge of a delay clock pulse, and for delaying the trailing edge of the first master clock pulse to form a trailing edge of the delay clock pulse.

19. The apparatus according to claim 18 wherein the write pulse means generates the leading edge of the write pulse in response to the leading edge of the delay clock pulse.

20. A method for writing a data bit to a memory and reading the data bit from the memory in a single clock cycle, the method comprising the steps of:

generating a first and a second master clock pulse, the first and the second master clock pulses each having a leading edge and a trailing edge, wherein a time interval between the leading edge of the first master clock pulse and the leading edge of the second master clock pulse defines the single clock cycle;

generating a write signal having a leading edge and a trailing edge, the leading edge of the write signal being generated between the leading edge of the first master clock pulse and the leading edge of the second master clock pulse;

writing the data bit into the memory in response to the write signal;

generating a read signal having a leading edge and a trailing edge, the leading edge of the read signal being generated after the leading edge of the write signal and before the leading edge of the second master clock pulse; and reading the data bit from the memory in response to the read signal.

21. The method according to claim 20, wherein the write signal generating step further comprises the step of generating the trailing edge of the write signal before the leading edge of the second master clock pulse; and wherein the read signal generating step further comprises the step of generating the trailing edge of the read signal before the leading edge of the second master clock pulse.

22. The method according to claim 20 wherein the write pulse generating step further comprises the step of generating the leading edge of the write pulse in response to the leading edge of the first master clock pulse.

23. The method according to claim 22 wherein the write pulse generating step further comprises the step of generating the trailing edge of the write pulse in response to the leading edge of the read pulse.

24. The method according to claim 23 wherein the read pulse generating step comprises the step of generating the trailing edge of the read pulse before the leading edge of the second master clock pulse.

25. The method according to claim 24 wherein the write pulse generating step further comprises the step of generating the trailing edge of the write pulse before the leading edge of the second master clock pulse.

26. The method according to claim 21 wherein the write signal generating step further comprises the steps of:

delaying the leading edge of the first master clock pulse to form a leading edge of a delay clock pulse; and delaying the trailing edge of the first master clock pulse to form a trailing edge of the delay clock pulse.

27. The method according to claim 26 wherein the write signal generating step further comprises the step of generating the leading edge of the write signal in response to the leading edge of the delay clock pulse.

28. A method for writing a data bit to an addressable storage location in a memory and reading the data bit from the addressable storage location in the memory in a single clock cycle, the method comprising the steps of:

receiving the data bit to be stored in the memory at a data input terminal of the memory;

receiving a read address at a read address input terminal of the memory;

receiving a write address at a write address input terminal of the memory;

generating a first and a second master clock pulse;

providing a write signal to a write enable terminal of the memory during the first master clock pulse;

writing the data bit from the data input terminal into the addressable storage location in the memory addressed by the write address during the first master clock pulse;

providing a read signal to a read enable terminal of the memory during the first master clock pulse; and reading the data bit from the addressable storage location in the memory addressed by the read address during the first master clock pulse, the read signal being generated after the write signal.

29. The method according to claim 28:

wherein the first and the second master clock pulse generating step further comprises the step of generating the first and the second master clock pulses, each having a leading edge and a trailing edge, wherein a time interval between the leading edge of the first master clock pulse and the leading edge of the second master clock pulse defines the single clock cycle;

wherein the write signal providing step further comprises the step of providing a write pulse having a leading edge and a trailing edge, the leading edge of the write pulse being generated between the leading edge of the first master clock pulse and the leading edge of the second master clock pulse; and wherein the read signal providing step further comprises the step of providing a read pulse having a leading edge and a trailing edge, the leading edge of the read pulse being generated after the leading edge of the write pulse.

30. The method according to claim 29:

wherein the write pulse providing step further comprises the step of providing the trailing edge of the write pulse before the leading edge of the second master clock pulse; and wherein the read pulse providing step further comprises the step of providing the trailing edge of the read pulse before the leading edge of the second master clock pulse.

31. The method according to claim 29 wherein the providing step further comprises the step of providing the leading edge of the write pulse in response to the leading edge of the first master clock pulse.

32. The method according to claim 31 wherein the write pulse providing step further comprises the step of providing the trailing edge of the write pulse in response to the leading edge of the read pulse.

33. The method according to claim 32 wherein the read pulse providing step further comprises the step of providing the trailing edge of the read pulse before the leading edge of the second master clock pulse.

34. The method according to claim 33 wherein the write pulse providing step further comprises the step of providing the trailing edge of the write pulse before the leading edge of the second master clock pulse.

35. The method according to claim 30 wherein the write pulse providing step further comprises the steps of:

delaying the leading edge of the first master clock pulse to form a leading edge of a delay clock pulse; and delaying the trailing edge of the first master clock pulse to form a trailing edge of the delay clock pulse having.

36. The method according to claim 35 wherein the write pulse providing step further comprises the step of providing the leading edge of the write pulse in response to the leading edge of the delay clock pulse.

37. The apparatus according to claim 9 wherein the first delay circuit comprises:

a first adjustable delay circuit, coupled to the master clock circuit, for delaying the leading edge of the first master clock pulse to form a leading edge of a delay clock pulse, and for delaying the trailing edge of the first master clock pulse to form a trailing edge of the delay clock pulse in response to a delay adjusting signal;

a second adjustable delay circuit, coupled to the master clock circuit, for generating a second delay clock pulse in response to the delay clock pulse and to the delay adjusting signal;

a cycle comparing circuit, coupled to the adjustable delay circuit, and the read signal circuit, for comparing the relationship between the read signal and the second delay clock pulse, and for generating a comparison signal; and a delay adjusting circuit, coupled to the cycle comparing circuit, to the first adjustable delay circuit, and to the second adjustable delay circuit, for generating the delay adjusting signal in response to the comparison signal.

38. A method for writing a data bit to a memory and reading the data bit from the memory in a single clock cycle, the method comprising the steps of:

generating a first and a second master clock, the first and the second master clock each having a leading edge and a trailing edge, wherein a time interval between the leading edge of the first master clock pulse and the leading edge of the second master clock pulse defines the single clock cycle;

delaying the leading edge of the first master clock pulse to form a leading edge of a delay clock pulse;

delaying the trailing edge of the first master clock pulse to form a trailing edge of the delay clock pulse;

delaying the leading edge of the delay clock pulse to form a delayed leading edge of the delay clock pulse;

inverting the delayed leading edge of the delay clock pulse to form an inverted delayed leading edge;

performing a logical NAND operation in response to the delay clock pulse and the inverted delayed leading edge, to produce a signal having a leading edge and a trailing edge, the signal having a width substantially shorter than a width of the delay clock pulse;

generating a write signal, the write signal having a leading edge and a trailing edge, the leading edge of the write signal being generated in response to the leading edge of the signal;

generating a read signal, the read signal having a leading edge and a trailing edge, the leading edge of the read signal being generated after the leading edge of the write signal, and the leading edge and the trailing edge of the read signal being generated before the leading edge of the second master clock pulse;

generating the trailing edge of the write signal in response to the leading edge of the read signal;

writing the data bit into the memory in response to the write signal; and reading the data bit from the memory in response to the read signal.

39. The method according to claim 38 wherein the write signal generating step further comprises:

flowing current through a first transistor in response to the signal to generate the leading edge of the write pulse; and flowing current through a second transistor in response to the read signal to generate the trailing edge of the write pulse.

40. The method according to claim 38 further comprising the steps of:

delaying the leading edge of the first master clock pulse to form a leading edge of a delay clock pulse in response to a delay adjusting signal;

delaying the trailing edge of the first master clock pulse to form a trailing edge of the delay clock pulse in response to the delay adjusting signal;

generating a second delay clock pulse in response to the delay clock pulse and to the delay adjusting signal;

comparing the relationship between the read signal and the second delay clock pulse, and generating a comparison signal in response thereto; and generating the delay adjusting signal in response to the comparison signal.

* * * * *